(12) United States Patent
Benson et al.

(10) Patent No.: US 7,435,620 B2
(45) Date of Patent: *Oct. 14, 2008

(54) LOW TEMPERATURE METHODS OF FORMING BACK SIDE REDISTRIBUTION LAYERS IN ASSOCIATION WITH THROUGH WAFER INTERCONNECTS

(75) Inventors: Peter A. Benson, Boise, ID (US);
Salman Akram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/777,797

(22) Filed: Jul. 13, 2007

(65) Prior Publication Data

US 2007/0259517 A1 Nov. 8, 2007

Related U.S. Application Data

(63) Continuation of application No. 11/129,105, filed on May 13, 2005.

(60) Provisional application No. 60/604,949, filed on Aug. 27, 2004.

(51) Int. Cl.
*H01L 21/00* (2006.01)

(52) U.S. Cl. ............... 438/108; 438/612; 438/613; 438/778; 438/E21.503; 438/E21.511

(58) Field of Classification Search ......... 438/106–127, 438/612–617; 257/778, E21.503, E21.511
See application file for complete search history.

(56) References Cited

U.S. PATENT DOCUMENTS 3,648,131 A 3/1972 Stuby (Continued)

FOREIGN PATENT DOCUMENTS

EP 0 486 829 A2 5/1992

(Continued)

OTHER PUBLICATIONS

One page copy of two overhead projections shown at a Semiconductor Industry Conference in San Diego, CA, "Activity Report of CSP Study Group" and "Chip Size Package," JWG#2-8, Jun. 1995.

(Continued)

*Primary Examiner*—Brook Kebede
(74) *Attorney, Agent, or Firm*—TraskBritt

(57) ABSTRACT

Low temperature processed back side redistribution lines (RDLs) are disclosed. Low temperature processed back side RDLs may be electrically connected to the active surface devices of a semiconductor substrate using through wafer interconnects (TWIs). The TWIs may be formed prior to forming the RDLs, after forming the RDLs, or substantially simultaneously to forming the RDLs. The material for the back side RDLs and various other associated materials, such as dielectrics and conductive via filler materials, are processed at temperatures sufficiently low so as to not damage the semiconductor devices or associated components contained on the active surface of the semiconductor substrate. The low temperature processed back side RDLs of the present invention may be employed with optically interactive semiconductor devices and semiconductor memory devices, among many others. Semiconductor devices employing the RDLs of the present invention may be stacked and electrically connected theretogether.

25 Claims, 10 Drawing Sheets

U.S. PATENT DOCUMENTS

| | | |
|---|---|---|
| 3,761,782 A | 9/1973 | Youmans |
| 4,772,936 A | 9/1988 | Reding et al. |
| 4,833,521 A | 5/1989 | Early |
| 4,862,322 A | 8/1989 | Bickford et al. |
| 4,948,754 A | 8/1990 | Kondo et al. |
| 4,998,159 A | 3/1991 | Shinohara et al. |
| 5,082,802 A | 1/1992 | Gelsomini |
| 5,138,434 A | 8/1992 | Wood et al. |
| 5,147,815 A | 9/1992 | Casto |
| 5,168,345 A | 12/1992 | Brossart |
| 5,216,278 A | 6/1993 | Lin et al. |
| 5,239,198 A | 8/1993 | Lin et al. |
| 5,246,880 A | 9/1993 | Reele et al. |
| 5,281,151 A | 1/1994 | Arima et al. |
| 5,289,346 A | 2/1994 | Carey et al. |
| 5,291,062 A | 3/1994 | Higgins, III |
| 5,311,057 A | 5/1994 | McShane |
| 5,327,008 A | 7/1994 | Djennas et al. |
| 5,327,013 A | 7/1994 | Moore et al. |
| 5,334,857 A | 8/1994 | Mennitt et al. |
| 5,355,283 A | 10/1994 | Marrs et al. |
| 5,365,409 A | 11/1994 | Kwon et al. |
| 5,376,825 A | 12/1994 | Tukamoto et al. |
| 5,379,191 A | 1/1995 | Carey et al. |
| 5,384,487 A | 1/1995 | Rostoker et al. |
| 5,386,142 A | 1/1995 | Kurtz et al. |
| 5,386,341 A | 1/1995 | Olsen et al. |
| 5,399,903 A | 3/1995 | Rostoker et al. |
| 5,422,163 A | 6/1995 | Kamiyama et al. |
| 5,424,492 A | 6/1995 | Petty et al. |
| 5,438,224 A | 8/1995 | Papageorge et al. |
| 5,440,171 A | 8/1995 | Miyano et al. |
| 5,454,160 A | 10/1995 | Nickel |
| 5,455,445 A | 10/1995 | Kurtz et al. |
| 5,483,101 A | 1/1996 | Shimoto et al. |
| 5,490,040 A | 2/1996 | Gaudenzi et al. |
| 5,490,324 A | 2/1996 | Newman |
| 5,497,397 A | 3/1996 | Hershey et al. |
| 5,498,767 A | 3/1996 | Huddleston et al. |
| 5,502,289 A | 3/1996 | Takiar et al. |
| 5,506,756 A | 4/1996 | Haley |
| 5,521,435 A | 5/1996 | Mizukoshi |
| 5,523,622 A | 6/1996 | Harada et al. |
| 5,593,927 A | 1/1997 | Farnworth et al. |
| 5,604,379 A | 2/1997 | Mori |
| 5,643,830 A | 7/1997 | Rostoker et al. |
| 5,646,828 A | 7/1997 | Degani et al. |
| 5,677,576 A | 10/1997 | Akagawa |
| 5,683,942 A | 11/1997 | Kata et al. |
| 5,710,071 A | 1/1998 | Beddingfield et al. |
| 5,715,144 A | 2/1998 | Ameen et al. |
| 5,726,489 A | 3/1998 | Matsuda et al. |
| 5,736,456 A | 4/1998 | Akram |
| 5,741,729 A | 4/1998 | Selna |
| 5,759,047 A | 6/1998 | Brodsky et al. |
| 5,762,744 A | 6/1998 | Shibata et al. |
| 5,817,986 A | 10/1998 | Davidson et al. |
| 5,844,304 A | 12/1998 | Kata et al. |
| 5,851,911 A | 12/1998 | Farnworth |
| 5,872,051 A | 2/1999 | Fallon et al. |
| 5,950,304 A | 9/1999 | Khandros et al. |
| 5,973,389 A | 10/1999 | Culnane et al. |
| 5,973,396 A | 10/1999 | Farnworth |
| 5,984,691 A | 11/1999 | Brodsky et al. |
| 5,992,012 A | 11/1999 | Kirkman |
| 5,994,766 A | 11/1999 | Shenoy et al. |
| 6,011,314 A | 1/2000 | Leibovitz et al. |
| 6,018,196 A | 1/2000 | Noddin |
| 6,020,220 A | 2/2000 | Gilleo et al. |
| 6,025,647 A | 2/2000 | Shenoy et al. |
| 6,048,753 A | 4/2000 | Farnworth et al. |
| 6,133,626 A | 10/2000 | Hawke et al. |
| 6,147,413 A | 11/2000 | Farnworth |
| 6,165,815 A | 12/2000 | Ball |
| 6,166,444 A | 12/2000 | Hsuan et al. |
| 6,168,969 B1 | 1/2001 | Farnworth |
| 6,169,329 B1 | 1/2001 | Farnworth et al. |
| 6,181,010 B1 | 1/2001 | Nozawa |
| 6,198,169 B1 | 3/2001 | Kobayashi et al. |
| 6,204,559 B1 | 3/2001 | Lin et al. |
| 6,225,143 B1 | 5/2001 | Rao et al. |
| 6,232,666 B1 | 5/2001 | Corisis et al. |
| 6,242,815 B1 | 6/2001 | Hsu et al. |
| 6,255,671 B1 | 7/2001 | Bojarczuk, Jr. et al. |
| 6,261,375 B1 | 7/2001 | Siniaguine et al. |
| 6,278,177 B1 | 8/2001 | Ryu |
| 6,287,893 B1 | 9/2001 | Elenius et al. |
| 6,287,976 B1 | 9/2001 | Siniaguine et al. |
| 6,316,839 B1 | 11/2001 | Farnworth |
| 6,322,903 B1 | 11/2001 | Siniaguine et al. |
| 6,323,134 B1 | 11/2001 | Siniaguine |
| 6,329,608 B1 | 12/2001 | Rinne et al. |
| 6,340,606 B1 | 1/2002 | Hashimoto |
| 6,426,562 B2 | 7/2002 | Farnworth |
| 6,429,096 B1 | 8/2002 | Yanagida |
| 6,518,089 B2 | 2/2003 | Coyle |
| 6,746,938 B2 | 6/2004 | Uchiyama |
| 6,800,930 B2 | 10/2004 | Jackson et al. |
| 6,838,377 B2 | 1/2005 | Tonami et al. |
| 6,864,172 B2 | 3/2005 | Noma et al. |
| 7,022,609 B2 * | 4/2006 | Yamamoto et al. .......... 438/694 |
| 7,232,754 B2 * | 6/2007 | Kirby et al. ................. 438/667 |
| 2002/0113324 A1 | 8/2002 | Cordes et al. |

FOREIGN PATENT DOCUMENTS

| | | |
|---|---|---|
| EP | 0 622 847 A3 | 11/1994 |
| EP | 0 660 405 A2 | 6/1995 |
| EP | 0 684 644 A1 | 11/1995 |
| EP | 0 692 823 A1 | 1/1996 |
| EP | 0 704 900 A3 | 4/1996 |
| JP | 57085244 A2 | 5/1982 |
| JP | 59229850 | 12/1984 |
| JP | 64-023546 A2 | 1/1989 |
| JP | 64-061934 A | 3/1989 |
| JP | 1132150 A2 | 5/1989 |
| JP | 5036857 A2 | 2/1993 |
| JP | 05129366 | 5/1993 |
| JP | 05-275578 | 10/1993 |
| JP | 06077293 | 3/1994 |
| JP | 08330355 A | 12/1996 |
| JP | 09-320075 | 12/1997 |
| JP | 9321175 A2 | 12/1997 |
| WO | 97/37374 A2 | 10/1997 |

OTHER PUBLICATIONS

Letter from Avi Ben-Har to Warren Farnworth, dated Mar. 27, 1996 (1 page), transmitting a copy of Zilber, G., et al., SlimcaseBA Thin Chip Size, Integrated Circuit Package (8 pages), to have been presented at ISHM-MCM Conference, Denver, CO Apr. 18, 1996.

Advertisement, "Laser Micromachining," MicroConnex Systems, 34935 SE Douglas Street, Snoqualmie, WA 98065, Unknown Date.

Advertisement, "ESI 520 Drilling Station," MicroConnex Systems, 34935 SE Douglas Street, Snoqualmie, WA 98065, Unknown Date.

Advertisement, "Damage Free Thinning," Tru-Si Technologies, 657 North Pastoria Ave., Sunnyvale, CA 94085, Unknown Date.

Advertisement, "Through-Silicon Vias," Tru-Si Technologies, 657 North Pastoria Ave., Sunnyvale, CA 94085, Unknown Date.

Advertisement, "TE-2001-M," Tru-Si Technologies, 657 North Pastoria Ave., Sunnyvale, CA 94085, Unknown Date.

Advertisement, "TE-2001-UT," Tru-Si Technologies, 657 North Pastoria Ave., Sunnyvale, CA 94085, Unknown Date.

http://www.trusi.com/article9.htm, Savastiouk, Sergey, "New Process Forms Die Interconnects by Vertical Wafer Stacking," pp. 1-2, ChipScale Review, Unknown Date.

http://www.trusi.com/article7.htm, Savastiouk, Sergey, "Moore's Law—the z dimension," pp. 1-3, Solid State Technology, unknown date.

http://www.trusi.com/articlefchip1.htm, Francis, David, "Thinning Wafers For Flip Chip Applications," pp. 1-8, High Density Interconnect, unknown date.

http://www.trusi.com/articlesb2.htm, Savastiouk et al., "Thinner packages vital for third-dimensional expansion," pp. 1-6, The Next Dimension, Advanced Packaging, Sep./Oct. 1998.

http://www.trusi.com/articlesc2.htm, Savastiouk, Sergey, "A new start-up promises to revolutionize wafer thinning and boost chip packaging density," pp. 1-3, Semiconductor European, Aug. 1998.

http://www.trusi.com/articlese1.htm, Savastiouk, Sergey, "Atomospheric Downstream Plasma-An Approach to 300-mm Wafer Thinning, Semi Global 300mm Report," pp. 1-4, Semi Global 300mm Report, Jul. 1998.

http://www.trusi.com/articlesf1.htm, Savastiouk et al., "Atmospheric downstream plasma—a new tool for semiconductor processing," pp. 1-6, Solid State Technology, Jul. 1998.

Advertisement, "Laser Micromachining," MicroConnex Systems, 34935 SE Douglas Street, Snoqualmie, WA 98065.

Advertisement, "ESI 520 Drilling Station," MicroConnex Systems, 34935 SE Douglas Street, Snoqualmie, WA 98065.

Advertisement, "Damage Free Thinning," Tru-Si Technologies, 657 North Pastoria Ave., Sunnyvale, CA 94085.

Advertisement, "Through-Silicon Vias," Tru-Si Technologies, 657 North Pastoria Ave., Sunnyvale, CA 94085.

Advertisement, "TE-2001-M," Tru-Si Technologies, 657 North Pastoria Ave., Sunnyvale, CA 94085.

Advertisement, "TE-2001-UT," Tru-Si Technologies, 657 North Pastoria Ave., Sunnyvale, CA 94085.

http://www.trusi.com/article9.htm, Savastiouk, Sergey, "New Process Forms Die Interconnects by Vertical Wafer Stacking," pp. 1-2, ChipScale Review.

http://www.trusi.com/article7.htm, Savastiouk, Sergey, "Moore's Law—the z dimension," pp. 1-3, Solid State Technology.

http://www.trusi.com/articlefchip1.htm, Francis, David, "Thinning Wafers For Flip Chip Applications," pp. 1-8, High Density Interconnect.

http://www.trusi.com/articlesb2.htm, Savastiouk et al., "Thinner packages vital for third-dimensional expansion," pp. 1-6, The Next Dimension, Advanced Packaging, Sep./Oct. 1998.

http://www.trusi.com/oleg1.htm, Siniaguine, Oleg, "Atmospheric Downstream Plasma Etching of Si Wafers," pp. 1-9.

* cited by examiner

LOW TEMPERATURE METHODS OF FORMING BACK SIDE REDISTRIBUTION LAYERS IN ASSOCIATION WITH THROUGH WAFER INTERCONNECTS

CROSS-REFERENCE TO RELATED APPLICATIONS

This application is a continuation of application Ser. No. 11/129,105, filed May 13, 2005, pending, which claims the benefit of Provisional Application Ser. No. 60/604,949, filed on Aug. 27, 2004. The disclosure of each of the foregoing applications is hereby incorporated by reference in its entirety by this reference.

BACKGROUND OF THE INVENTION

1. Field of the Invention:

The present invention relates to low temperature processes for forming back side redistribution layers for semiconductor devices. More particularly, the present invention relates to low temperature processing for back side redistribution layers as suitable for use in optically interactive semiconductor devices and other semiconductor devices, and resulting structures.

2. State of the Art:

Interconnection and packaging-related issues are among the factors that determine not only the number of circuits that can be integrated on a semiconductor die or "chip," but also the performance of the chip. These issues have gained in importance as advances in chip design have led to reduced sizes of transistors and enhanced chip performance. The industry has come to realize that merely having a fast chip will not necessarily result in a fast system. The fast chip must also be supported by equally fast and reliable electrical connections. Essentially, on-chip connections, in conjunction with those of the chip's associated packaging, supply the chip with signals and power, provide signals from the chip and redistribute the tightly spaced or pitched terminals or bond pads of the chip to the terminals of a carrier substrate, such as a printed circuit board.

Flip-chip technology is well known to those of ordinary skill in the art, as the technology has been in use for over 30 years and continues to develop. A flip-chip semiconductor device conventionally comprises a semiconductor die having an active surface having active integrated circuitry components formed therein and bearing contacts such as bond pads, and an opposing back surface devoid of active components or, usually, of any features whatsoever. A dielectric layer, for example, of silicon dioxide or silicon nitride, may be formed over the active surface by techniques well known in the art. Apertures may be defined in the dielectric layer (also termed a "passivation layer") using well-known photolithographic techniques to mask and pattern the dielectric layer and etch the same with hydrofluoric acid to expose the contacts or bond pads on the active surface. The bond pads may be respectively connected to traces of a redistribution layer on the dielectric layer in the form of redistribution lines in a well-known manner, for example, by evaporating or sputtering a layer of aluminum or an alloy thereof over the passivation layer, followed by masking and etching the layer to define the traces. The redistribution lines of the redistribution layer enable the external connections of the semiconductor device provided by the relatively compact arrangement of closely spaced or pitched bond pads to be distributed over a larger surface area with wider spacing or pitch between external connections to higher-level packaging. Discrete conductive elements, such as solder bumps or balls, are typically placed upon a pad located at an end of each redistribution line to enable electrical connection with contact pads or terminals on the higher-level packaging, usually comprising a carrier substrate, such as a printed circuit board. The flip-chip semiconductor device, with the solder bumps on its active surface, is "flipped" and attached face down to a surface of the carrier substrate, with each solder bump on the semiconductor device being positioned on the appropriate contact pad or terminal of the carrier substrate. The assembly of the flip-chip semiconductor device and the carrier substrate is then heated so as to reflow the solder bumps to a molten state and thus connect each bond pad on the semiconductor device through its associated redistribution line and solder bump to an associated contact pad or terminal on the carrier substrate. Because the flip-chip arrangement does not require leads of a lead frame or other carrier structure coupled to a semiconductor die and extending beyond the lateral periphery thereof, it provides a compact assembly in terms of the semiconductor die's "footprint" on the carrier substrate.

Redistribution lines may also be located on the back side of a semiconductor die and electrically connected to the bond pads of the active surface through conductive filled vias that extend through the semiconductor die. U.S. patent application Ser. No. 10/209,823, entitled, "Semiconductor Dice Having Backside Redistribution Layer Accessed Using Through-Silicon Vias, Methods of Fabrication and Assemblies," assigned to the assignee of the present invention and the disclosure of which is hereby incorporated by reference herein, teaches use of rerouting redistribution lines on a back side of a semiconductor die accessed from an active surface of a semiconductor substrate through vias. While such a redistribution layer may help reduce the necessary footprint from a semiconductor die and helps alleviate cross-talk between adjacent redistribution lines, the processing techniques employed do not accommodate the sensitive, easily damaged nature of the various components on the active surface.

For example, optically interactive semiconductor devices, such as complementary metal oxide semiconductor (CMOS) imagers, employ particularly temperature sensitive components in the form of microlenses disposed on their active surfaces, which begin to degrade at about 220° C. Semiconductor memory devices, while not as limiting with respect to temperature-induced damage, experience subsequent operational difficulties when exposed to temperatures of 250° C. and may sustain irreparable damage commencing at about 300° C. exposure.

Accordingly, a need exists for methods of fabricating back side redistribution lines and associated structures, such as conductive vias, that do not damage any of the active surface circuitry of a semiconductor device or components associated with such semiconductor devices.

BRIEF SUMMARY OF THE INVENTION

The present invention, in a number of embodiments, includes semiconductor devices that utilize back side (also termed "back surface" herein) redistribution lines and low temperature processing methods to form such back side redistribution lines, conductive via linings, and dielectric layers associated therewith. The back side redistribution lines may be used on a variety of semiconductor devices such as, for example, optically interactive semiconductor devices or semiconductor memory devices. By employing a low temperature processing route to form the back side redistribution lines, conductive via fillers and dielectric layers, damage to the active surface devices and other components is prevented.

For example, if the active surface contains optically interactive semiconductor devices, the processing may be effected at a temperature so as not to damage sensitive microlenses of the optically interactive semiconductor devices. If the active surface devices are semiconductor memory devices, the processing may be effected at a temperature so as not to randomize the memory devices or redistribute dopants in structures forming the memory devices.

In one aspect of the present invention, a semiconductor device having at least one redistribution line formed over its back surface is disclosed. The semiconductor device includes at least one semiconductor die having a back surface and an active surface including at least one optically interactive semiconductor device thereon. At least one via filled with an electrically conductive material and in electrical communication with the active surface of at least one semiconductor device extends from the active surface to the back surface. At least one redistribution line in electrical communication with the electrically conductive material disposed within the at least one via may be formed over and extend to a predetermined distal location over the back surface. The at least one redistribution line, conductive filler for the at least one via, and dielectric layers covering the back side of the substrate, lining the at least one via and covering the at least one redistribution line, all comprise materials deposited at sufficiently low temperatures so as to prevent physical or operational damage to the at least one optically interactive semiconductor device and other components, such as microlenses, located on the active surface. Discrete conductive elements, such as solder balls, may be formed at the predetermined locations on the redistribution lines to provide the external electrical contacts for the semiconductor die. A substrate such as, for example, another semiconductor device or a printed circuit board may be located and positioned relative to the at least one semiconductor die to electrically connect the discrete conductive elements thereon to interconnect elements on a surface of the substrate. The present invention also encompasses other types of semiconductor devices, such as memory devices, microprocessors and logic devices, without limitation. In such instances, the temperature constraints for fabrication of the redistribution line and associated structures and layers will be dictated by the temperature sensitivity of the semiconductor devices and associated components present on the active surface of the semiconductor substrate in question.

In another aspect of the present invention, a stacked semiconductor device assembly is disclosed. A first semiconductor die having an active surface including at least one optically interactive semiconductor device thereon and a back surface is provided. The first semiconductor die includes at least one via filled with an electrically conductive material, the at least one via extending from the active surface to the back surface thereof. A second semiconductor die is provided having at least one via filled with an electrically conductive material, the at least one via extending from an active surface to a back surface of the second semiconductor die. The second semiconductor die further includes at least one redistribution line in electrical communication with the at least one via. The at least one redistribution line may be formed over the back surface and extend thereover from the at least one via to a predetermined location. The first and the second semiconductor dice may be stacked back surface-to-back surface so that the back surface of the first semiconductor die opposes the back surface of the second semiconductor die. As in the previous embodiment, the at least one redistribution line on the back surface of the second semiconductor die is electrically interconnected with the at least one via on the first semiconductor die to form the stacked semiconductor assembly. As in the previous embodiment, the at least one redistribution line, conductive filler for the vias, and dielectric layers covering the back side of the substrate, lining the vias and covering the at least one redistribution line, all comprise materials deposited at sufficiently low temperatures so as to prevent physical or operational damage to the at least one optically interactive semiconductor device and other components, such as microlenses, located on the active surface.

In another aspect of the present invention, a method of fabricating a semiconductor device is disclosed. At least one semiconductor die having a back surface and an active surface including at least one semiconductor device (such term including associated structures and components) thereon is provided. A first dielectric layer may be deposited on the back surface at a temperature below that sufficient to damage the at least one semiconductor device on the active surface. At least one via extending from a bond pad on the active surface to the back surface may be formed. A second dielectric layer that covers the first dielectric layer and an inner region of the at least one via may be deposited below a temperature sufficient to damage the at least one semiconductor device on the active surface. The back side of the at least one bond pad located on the active surface at the top of the at least one via may be exposed by a process, such as etching, to remove unwanted portions of the second dielectric layer. The at least one via may then be at least partially filled with an electrically conductive material deposited below a temperature sufficient to damage the at least one semiconductor device on the active surface. A layer of conductive redistribution line precursor material, such as a metal, may be deposited on the back side below a temperature sufficient to damage the at least one semiconductor device on the active surface, the redistribution line precursor material deposited on the second dielectric layer and on the electrically conductive material in the at least one via. At least one redistribution line in electrical communication with the electrically conductive material within the via may be formed from the layer of conductive redistribution line precursor material. In an exemplary embodiment, the electrically conductive material filling the at least one via and the layer of conductive redistribution line precursor material may be integrally formed of the same material. A third dielectric layer may be deposited on the at least one redistribution line below a temperature sufficient to damage the at least one semiconductor device on the active surface. At least one aperture may be formed through the third dielectric layer to expose a portion of the at least one redistribution line, the at least one aperture configured to receive a discrete conductive element therein, such as a solder ball or bump.

In yet another aspect of the present invention, a method of fabricating a semiconductor device is disclosed. At least one semiconductor die having a back surface and an active surface including at least one semiconductor device thereon is provided. A first dielectric layer may be deposited on the back surface below a temperature sufficient to damage the at least one semiconductor device on the active surface. A conductive layer of redistribution line precursor material may be deposited on the first dielectric layer below a temperature sufficient to damage the at least one semiconductor device on the active surface. At least one redistribution line may be formed from the redistribution line precursor material. A second dielectric layer may be deposited over the at least one redistribution line and at least a portion of the first dielectric layer below a temperature sufficient to damage the at least one semiconductor device on the active surface. At least one aperture may be formed in the second dielectric layer to expose a portion of the at least one redistribution line, the at least one aperture configured to receive a discrete conductive element therein, such as a solder ball or bump. At least one via may be formed that extends from the back surface to a predetermined depth below the active surface, such as the back side of a bond pad. A third dielectric layer that covers the first dielectric layer and the inner region of the at least one via may be deposited below a temperature sufficient to damage the at least one semiconductor device on the active surface, and the back side of the bond pad exposed therethrough. The at least one via may be filled with an electrically conductive material deposited below a temperature sufficient to damage the at least one semiconductor device on the active surface to enable electrically connecting the electrically conductive material in the at least one via with the at least one redistribution line and the at least one semiconductor device of the active surface.

The present invention also includes methods of packaging and encapsulating semiconductor devices, including optically interactive semiconductor devices.

These features, advantages, and alternative aspects of the present invention will be apparent to those skilled in the art from a consideration of the following detailed description taken in combination with the accompanying drawings.

BRIEF DESCRIPTION OF THE SEVERAL VIEWS OF THE DRAWINGS

In the drawings, which illustrate what is currently considered to be the best mode for carrying out the invention and in which like elements and features are identified by like reference numerals.

DETAILED DESCRIPTION OF THE INVENTION

The present invention, in a number of embodiments, includes methods for fabricating semiconductor devices having low temperature processed back side redistribution lines and dielectric layers and the resulting structures, and assemblies of such semiconductor devices. The present invention may be used with a variety of semiconductor devices such as, for example, semiconductor memory dice or optically interactive semiconductor devices.

Figure 1A:
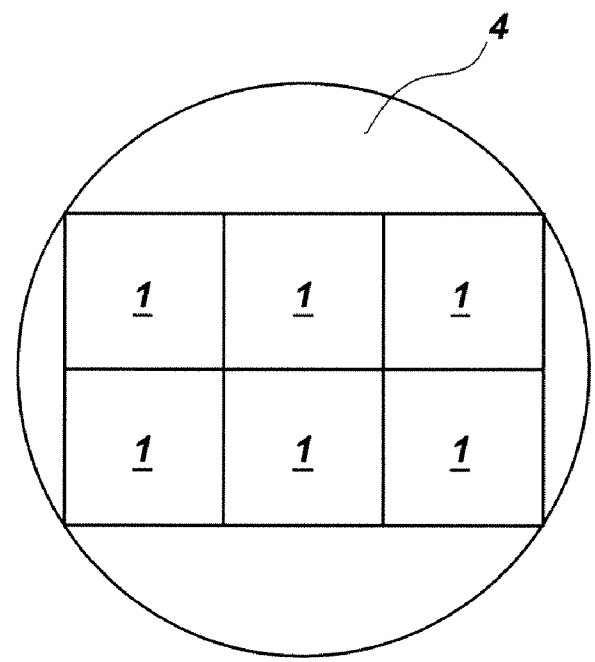
FIG. 1A is a plan view of a plurality of semiconductor dice including optically interactive semiconductor devices.
Figure 1B:
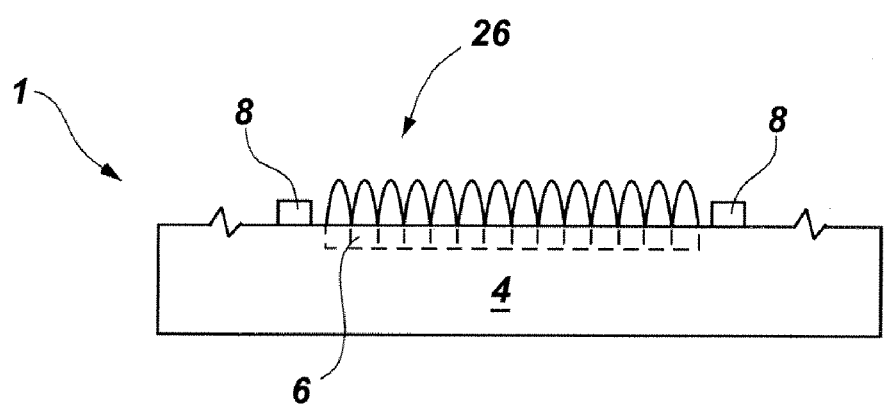
FIG. 1B is a partial sectional view of FIG. 1A.

Referring to FIG. 1A, a plan view of a substrate 4 is shown. Substrate 4 comprises a plurality of semiconductor dice 1. FIG. 1B shows a partial sectional view of a semiconductor die 1 having an active surface 26 thereof bearing an array of optically interactive semiconductor devices 6 with bond pads 8 operably coupled thereto. The array of optically interactive semiconductor devices 6 may comprise optically interactive semiconductor devices such as, for example, charge coupled device (CCD) image sensors or complementary metal oxide semiconductor (CMOS) image sensors. The bond pads 8 may be formed of a conductive material, such as aluminum or an aluminum alloy, which provides external electrical connections to the array of optically interactive semiconductor devices 6. The bond pads 8 are located adjacent the periphery of the array of optically interactive semiconductor devices 6. Substrate 4 may be, without limitation, a bulk semiconductor substrate (e.g., a full or partial conventional wafer of semiconductor material, such as silicon, gallium arsenide or indium phosphide, or a silicon-on-insulator (SOI) type substrate, such as silicon-on-ceramic (SOC), silicon-on-glass (SOG), or silicon-on-sapphire (SOS), etc.) that includes a plurality of semiconductor dice thereon, and as used herein, the term "substrate" encompasses any and all of the foregoing structures. Substrate 4 may also be a thinned full or partial semiconductor wafer having a thickness of, for example, 750 µm.

Figure 2A:
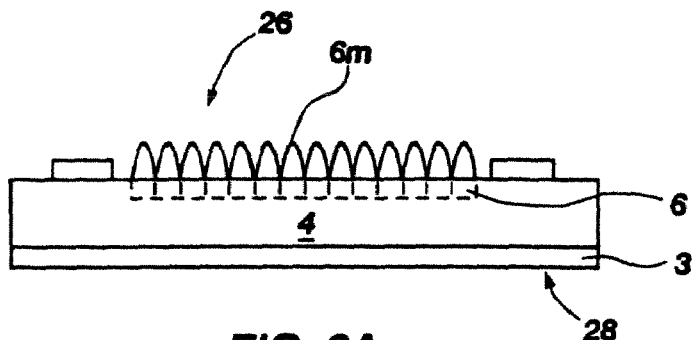
FIGS. 2A-2G illustrate an exemplary method of the present invention for forming low temperature processed back side redistribution lines and resulting structures.

An exemplary embodiment of a method of the present invention for fabricating a semiconductor device having a low temperature processed back side redistribution layer electrically connected to the bond pads 8 using through wafer interconnects (TWIs) is illustrated in FIGS. 2A-2G. In the exemplary embodiment shown in FIGS. 2A-2G, the TWIs are formed prior to the formation of the back side redistribution layer. Referring to FIG. 2A, a dielectric layer 3 may be deposited on back side 28 of the substrate 4 having at least one, and preferably a plurality of, optically interactive semiconductor devices 6 in an array on the active surface 26 thereof. The dielectric layer 3 may be an oxide or nitride such as, for example, silicon dioxide (e.g., TEOS type silicon dioxide) or silicon nitride. The deposition of the dielectric layer 3 may be effected by chemical vapor deposition (CVD), atomic layer deposition (ALD), reactive sputtering, or another suitable technique. It is currently preferred to form a silicon dioxide dielectric layer 3 at 175° C. using plasma enhanced CVD (PECVD) employing a silane gas source. The deposition of the dielectric layer 3 is effected at a temperature that will not damage the optically interactive semiconductor devices 6 or associated components located on the active surface 26 of substrate 4. In order to prevent damage to the microlenses 6m of array of optically interactive semiconductor devices 6 on the active surface 26 of substrate 4, the dielectric layer 3 may be deposited below the cure temperature of the polyimide used to form the microlenses 6m. For example, if the polyimide is cured at 220° C., dielectric layer 3 may be deposited at a temperature below this cure temperature of 220° C. Thus, the deposition temperature of the dielectric layer 3 is selected so as not to damage the optically interactive semiconductor devices 6 and components, such as microlenses 6m associated with the optically interactive semiconductor devices 6 contained on the active surface 26 of the substrate 4. As noted above, a suitable exemplary deposition temperature for the dielectric layer 3 is about 175° C.

Figure 2B:
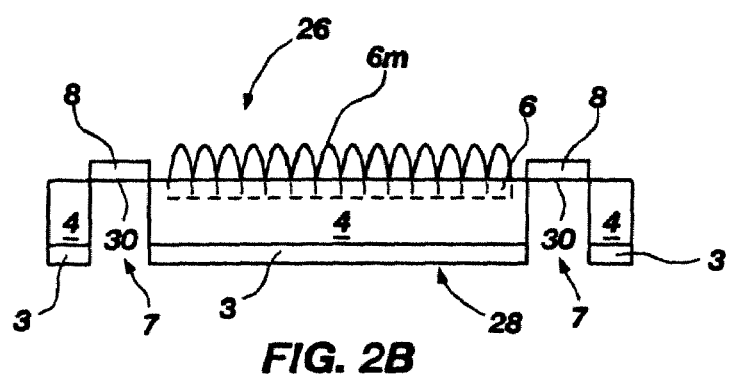

Referring to FIG. 2B, a plurality of vias 7 may be formed by etching, drilling, laser ablation, or by another suitable technique. The vias 7 extend therein substantially perpendicular to the plane of the substrate 4, exposing the back side 30 of each bond pad 8. The diameter of vias 7 may be on the order of 25 µm to about 40 µm. Laser ablation may be effected using equipment, such as the Model 5000-series lasers, offered currently by ElectroScientific Industries of Portland, Oreg. One specific, suitable piece of equipment is a 355 nm wavelength UV YAG laser, Model 2700, which may be used to form vias as small as 25 μm in diameter. One hundred pulses using this laser will form a 750 μm deep via through silicon. A machine vision system or fiducial marks on back side 28 of substrate 4 may be used to align the laser to enable precisely forming vias 7 in a desired location. If desired, a TMAH (tetramethyl ammonium hydroxide) solution may be used to clean and remove the heat-affected zone in substrate 4 surrounding laser-drilled vias 7, which also results in a squared cross-section for the via 7. Another suitable laser for making holes through a full thickness or thinned wafer is the Xise 200, offered by Xsil Limited of Dublin, Ireland. A dry, anisotropic silicon etch may also be used to form vias 7, such a technique not affecting bond pads 8 and the material of bond pads 8 acting as an etch stop once the silicon of substrate 4 is completely penetrated.

Figure 2C:
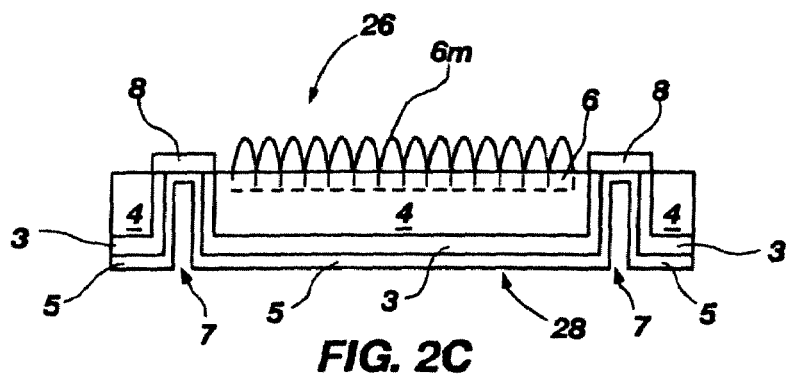

Referring to FIG. 2C, a second dielectric layer 5 may be formed over dielectric layer 3 and over the inside walls of vias 7 and the back side 30 of bond pads 8. Dielectric layer 5 may be an oxide or nitride such as, for example, silicon dioxide or silicon nitride. Dielectric layer 5 may be identical in chemical composition to dielectric layer 3. As with dielectric layer 3, the deposition of dielectric layer 5 may be effected by CVD, PECVD, ALD, reactive sputtering, or another suitable technique and the processing temperature is selected so as not to damage the optically interactive semiconductor devices 6 on the active surface 26 of substrate 4. Therefore, dielectric layer 5 may be deposited in an identical manner to dielectric layer 3. It is currently preferred to effect forming silicon dioxide dielectric layer 5 at 175° C. using PECVD employing a silane gas source. Following deposition of dielectric layer 5, a spacer etch may be used to remove any of dielectric layer 5 covering the back side 30 of bond pads 8. It should be noted that, if vias 7 for the TWIs are formed as the first step in the process, dielectric layer 3 may be omitted, since dielectric layer 5 will cover both the back side 28 of substrate 4, as well as the side walls of vias 7.

Figure 2D:
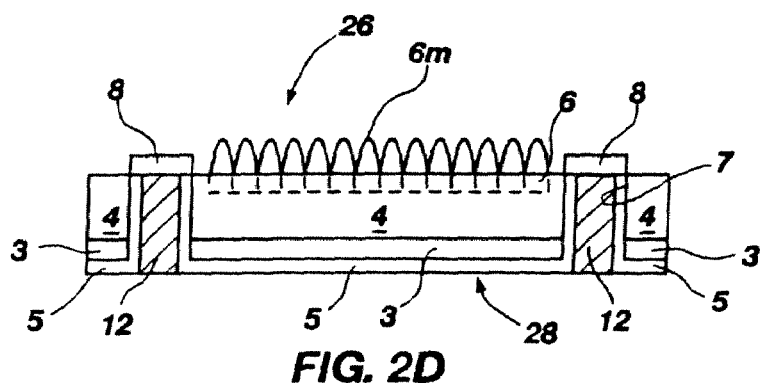

Referring to FIG. 2D, the plurality of vias 7 may then be filled with a conductive material 12, such as aluminum, copper, and alloys thereof. Vias 7 may be filled to be approximately level with the dielectric layer 5. Deposition of conductive material 12 may be effected by electroplating, electroless plating, or a physical vapor deposition (PVD) technique. Any excess conductive material 12 covering dielectric layer 5 may be removed by appropriately photolithographically patterning and etching. Vias 7 may also be filled by solder filling employing a solder alloy such as, for example, tin/lead, tin/antimony, or tin/silver/copper alloys. If desired or necessary, a seed layer, around 5 Å to 100 Å, may be provided to assist with nucleation of a conductive material 12, such as copper during electroless plating of conductive material 12. Exemplary examples of seed layers are titanium nitride (TiN) deposited by ALD at 155° C. sequentially using three precursor gases to form each monolayer: $TiCl_4$, $H_2$ and $NH_3$, or tungsten deposited using a $WF_6$ precursor gas by ALD at 170° C. to 200° C. The latter ALD process is currently preferred. ALD is particularly well suited for covering the inside of high aspect ratio vias 7 having aspect ratios of, for example, about 20:1. Such seed layers may be approximately 20 monolayers thick, which may approximate a thickness of about 100 Å. Seed layers may range in thickness, for example, from about 5 Å to about 100 Å. As with the previous material layers, conductive material 12 is deposited below a temperature sufficient to damage the optically interactive semiconductor devices 6 or associated components, such as microlenses 6m on the active surface 26 of substrate 4. An exemplary PVD deposition temperature for conductive material 12 is between about 100° C. and about 150° C.

Figure 2E:
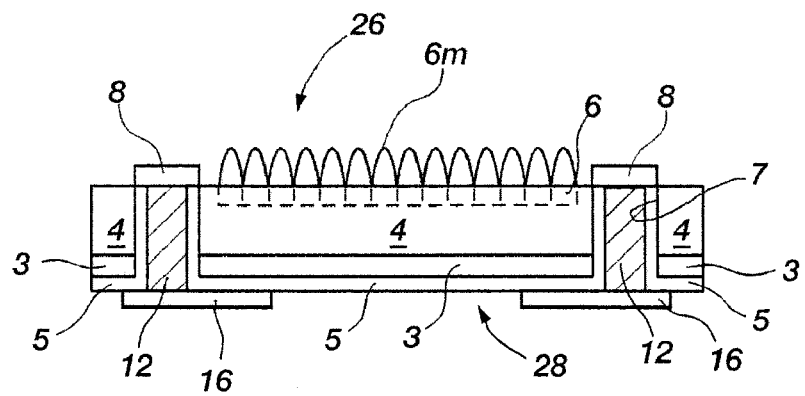

Referring to FIG. 2E, a metallization layer may be deposited to cover the dielectric layer 5 and conductive material 12 filling the vias 7. The metallization layer contacts at least a portion of conductive material 12 to form an electrically conductive pathway from the back side 28 of substrate 4 to the bond pads 8 carried on the active surface 26 of substrate 4. The metallization layer may then be photolithographically patterned and etched as is known in the art to form redistribution lines 16 in the form of traces that are electrically connected with conductive material 12, resulting in the structure shown in FIG. 2E. The redistribution lines 16 extend from the conductive material 12 in associated vias 7 to predetermined distal locations on the back side 28 of substrate 4. Exemplary materials for the metallization layer may be aluminum, copper, and alloys thereof. As with the deposition of dielectric layers 3 and 5, the deposition temperature of metallization layer may be selected such that the deposition process does not damage any of the semiconductor devices or components associated therewith on the active surface 26 of substrate 4. Suitable deposition processes include evaporation, sputtering, CVD, or another suitable technique. In an exemplary embodiment, the metallization layer may be deposited using sputtering at a temperature between about 100° C. and 150° C.

Figure 2F:
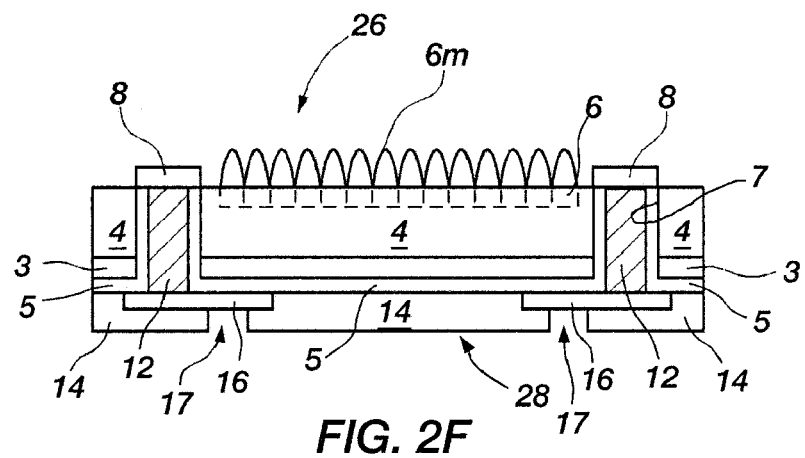

Referring to FIG. 2F, following the formation of redistribution lines 16, another dielectric layer 14 may be deposited in the same manner and of the same types of materials as the previous dielectric layers 3 and 5, again at a temperature sufficiently low so as not to damage optically interactive semiconductor devices 6 or microlenses 6m. Dielectric layer 14 covers redistribution lines 16 and exposed portions of dielectric layer 5. By appropriately masking and etching dielectric layer 14, apertures 17 may be formed enabling access therethrough to the redistribution line 16.

Figure 2G:
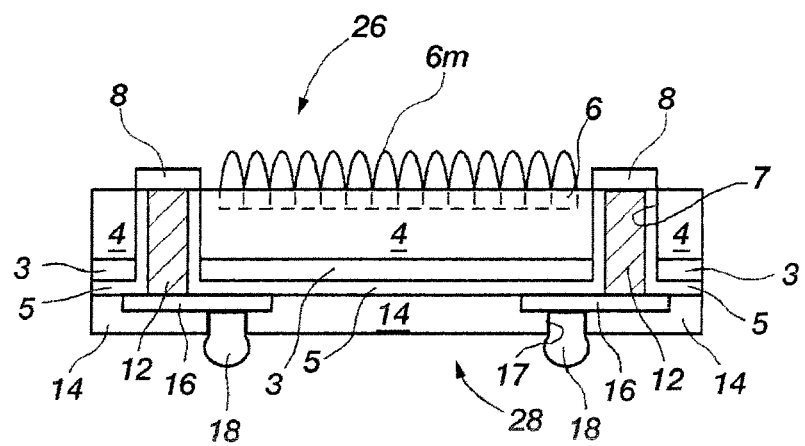

Conductive bumps 18 may be deposited in apertures 17 creating an electrically conductive pathway from a conductive bump 18 to redistribution lines 16 to conductive material 12 to bond pad 8 as illustrated in FIG. 2G. Conductive bumps 18 may be formed and configured on the redistribution lines 16 to correspond and interconnect with an interconnect pattern defined by contact pads or terminals of another substrate. Conductive bumps 18 may comprise, for example, solder balls or bumps of tin and lead which are preformed and placed on redistribution lines 16 and then at least partially reflowed, or masses of solder paste, which are stenciled on the back side 28 of substrate 4 at desired locations and then reflowed, to form solder balls. As desired or required, a solder mask (not shown) may be applied prior to solder ball formation, which solder mask may then be removed or remain for additional protection of back side 28 of substrate 4. The solder mask may, if applied to a sufficient depth, be used to squeegee solder paste in sufficient quantity for the formation of solder balls by reflow in lieu of using a stencil or screen. Alternatively, conductive bumps 18 may comprise masses of conductive or conductor-filled epoxy formed as columns or pillars. Thereafter, the semiconductor device having a low temperature processed back side redistribution layer may be electrically connected to another electrical device such as a semiconductor memory die, another type of semiconductor device, or higher-level packaging such as, for example, a printed circuit board (PCB) using the plurality of conductive bumps 18.

Figure 3A:
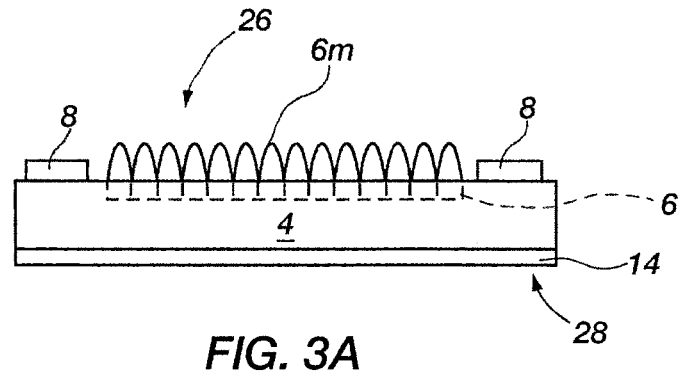
FIGS. 3A-3J illustrate another exemplary method of the present invention for forming low temperature processed back side redistribution lines and resulting structures.

Another exemplary embodiment of a method of the present invention for fabricating a semiconductor device having a low temperature processed back side redistribution layer electrically connected to bond pads 8 using TWIs is illustrated in FIGS. 3A-3J. In the exemplary embodiments shown in FIGS. 3A-3J, the vias 7 are formed after the formation of the back side redistribution lines 16. Referring to FIG. 3A, a dielectric layer 14 may be deposited on the back side 28 of substrate 4 having at least one array of optically interactive semiconductor devices 6 covered by microlenses 6m on an active surface 26 thereof. Dielectric layer 14 may be an oxide or nitride such as, for example, silicon dioxide (e.g., TEOS type silicon dioxide) or silicon nitride. The chemical composition and deposition of dielectric layer 14 may be effected by CVD, PECVD, ALD, reactive sputtering, or another suitable technique as performed in the previous embodiment illustrated in FIGS. 2A-2G. The deposition of dielectric layer 14 is effected at a sufficiently low temperature so as to not damage the optically interactive semiconductor devices 6 contained on the active surface 26 of substrate 4. In order not to damage the microlenses 6m of the array of optically interactive semiconductor devices 6 on the active surface 26 of substrate 4, the dielectric layer 14 may be deposited below the cure temperature of the polyimide used to form the microlenses 6m. For example, if the polyimide is cured at 220° C., dielectric layer 14 may be deposited at a temperature below this cure temperature of 220° C. Thus, the deposition temperature of the dielectric layer 14 is selected so as not to damage the optically interactive semiconductor devices 6 and associated components, such as microlenses 6m, carried on the active surface 26 of the substrate 4. It is currently preferred to effect forming a silicon dioxide dielectric layer 14 at 175° C. using PECVD employing a silane gas source.

Figure 3B:
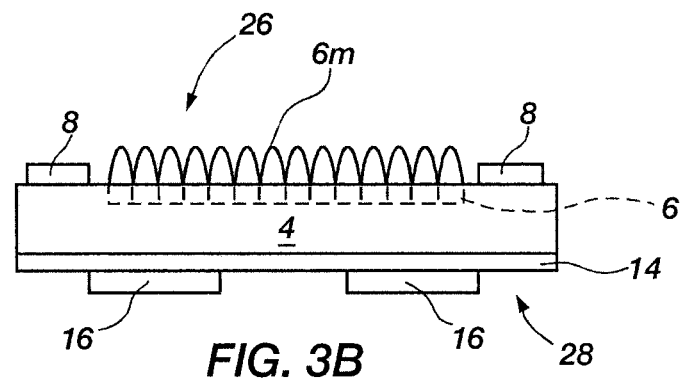

Referring to FIG. 3B, following deposition of dielectric layer 14, a metallization layer may be deposited on dielectric layer 14. The metallization layer may then be photolithographically patterned and etched to form redistribution lines 16 in the form of traces resulting in the structure shown in FIG. 3B. The redistribution lines 16 will, eventually, be electrically connected with bond pads 8 using vias 7 filled with a conductive material (i.e., TWIs). The redistribution lines 16 extend from locations proximate bond pads 8 on the back side 28 to predetermined distal locations on the back side 28 of substrate 4. Exemplary materials for the metallization layer are aluminum, copper, and alloys thereof. As with the deposition of dielectric layer 14, the deposition temperature of the metallization layer maybe selected such that the deposition process does not damage any of the semiconductor devices or components associated therewith on the active surface 26 of substrate 4. Suitable deposition processes include evaporation, sputtering, CVD, or other suitable techniques. In an exemplary embodiment, the metallization layer may be deposited using sputtering at a temperature between about 100° C. and 150° C.

Figure 3C:
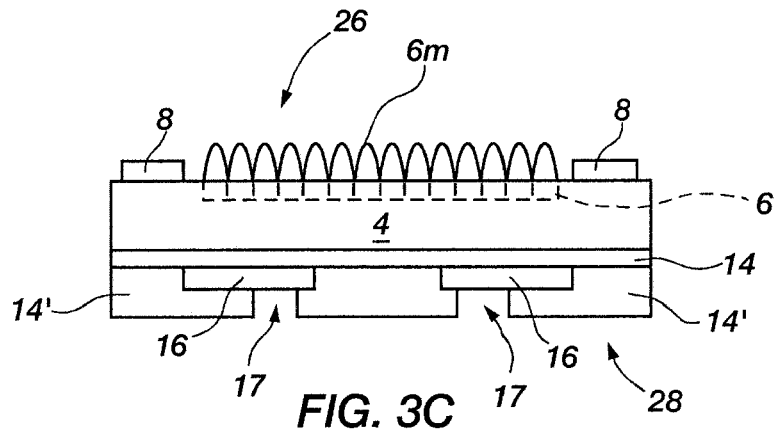
Figure 3D:
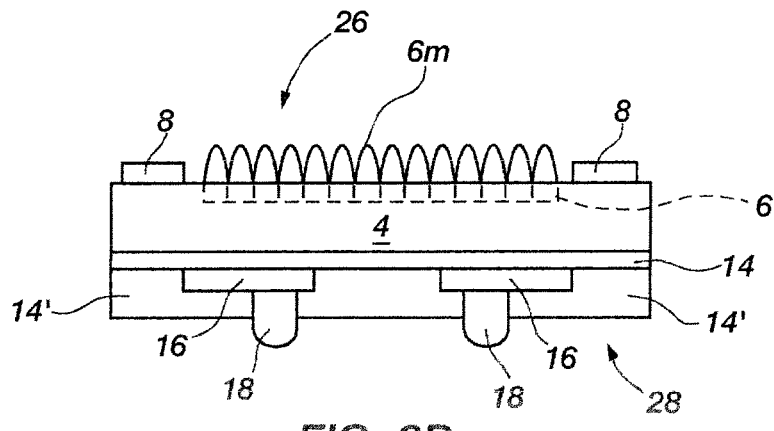

Following the deposition of dielectric layer 14, another dielectric layer 14' may be deposited to cover dielectric layer 14 and redistribution lines 16. As with dielectric layer 14, the deposition of dielectric layer 14' may be identical in chemical composition to dielectric layer 14 and be deposited in an identical manner to avoid damage to any of the semiconductor devices on the active surface 26 of substrate 4. Dielectric layer 14' may be photolithographically patterned and etched to form apertures 17 therethrough enabling access to the redistribution lines 16 formed from the metallization layer as shown in FIG. 3C. Conductive bumps 18 may be deposited in apertures 17, as performed in the previous embodiment of FIGS. 2A-2G, creating an electrically conductive pathway from conductive bump 18 to redistribution lines 16 as illustrated in FIG. 3D.

Figure 3E:
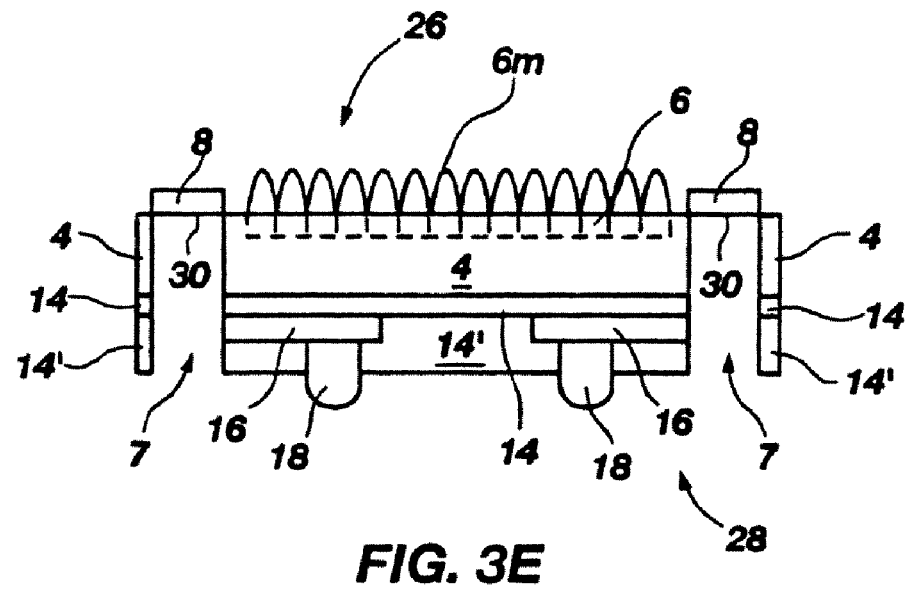
Figure 3F:
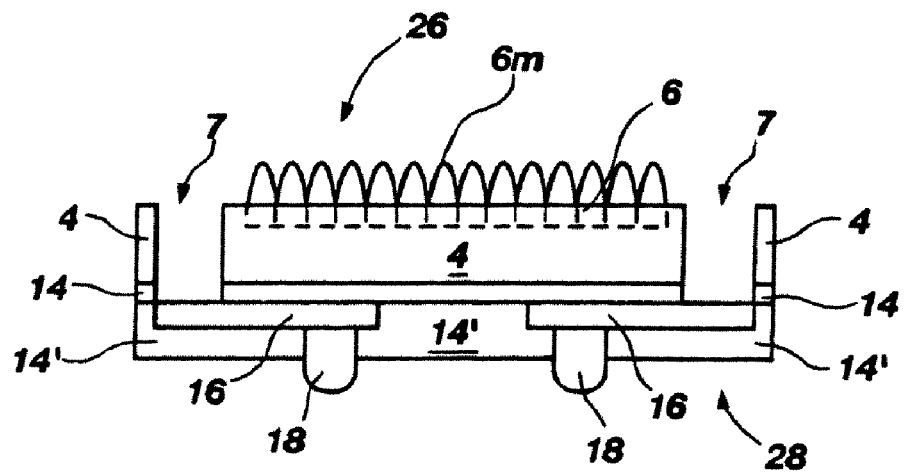

Referring to FIGS. 3E and 3F, vias 7 may then be formed using etching, drilling, laser ablation, or by another suitable technique as performed in the previous embodiment illustrated in FIGS. 2A-2G. As shown in FIG. 3E, vias 7 may be formed from the back side 28 to extend substantially perpendicular to the plane of substrate 4 and expose the back sides 30 of each bond pad 8. In another exemplary embodiment, shown in FIG. 3F, vias 7 may be formed from the active surface 26 to extend substantially perpendicular to the plane of substrate 4 to terminate at the redistribution line 16. With continued reference to FIG. 3F, vias 7 may extend to the upper surface of the redistribution line 16 or partially through the redistribution line 16. If the vias 7 are formed from the active surface 26 in a downward direction, bond pads 8 may be, optionally, present. As with the previous embodiments, a TMAH solution may be used to clean laser-drilled vias 7, resulting in a squared cross-section for the vias.

Figure 3G:
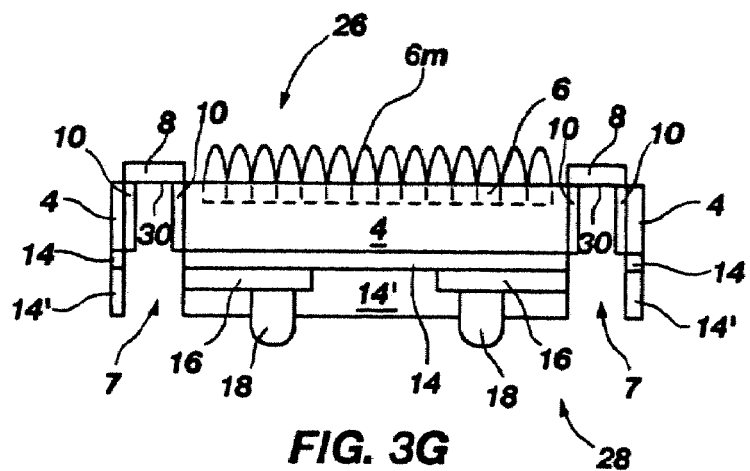
Figure 3H:
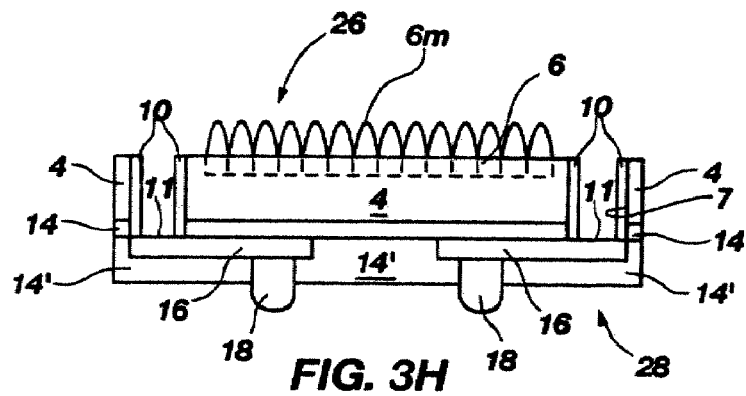

Regardless of whether the vias 7 are formed from the active surface 26 downward or from the back side 30 upward toward bond pads 8, following formation of vias 7, a dielectric layer 10 may be deposited on the inside of vias 7, as shown in FIGS. 3G and 3H. The deposition technique for, and composition of, dielectric layer 10, may be identical to that of dielectric layers 14 and 14'. Following deposition of dielectric layer 10 on the structure of FIG. 3E, any portion of dielectric layer 10 covering the back side 30 of bond pads 8 or the sides of redistribution lines 16 surrounding vias 7 may be removed using, for example, laser ablation, resulting in the structure shown in FIG. 3G. Similarly, as shown in FIG. 3H, wherein dielectric layer 10 has been disposed on the structure of FIG. 3F, an etchant may be used to remove any of dielectric layer 10 covering the upper surface 11 of the redistribution line 16 at the lower ends of vias 7 formed from the active surface 26 down.

Figure 3I:
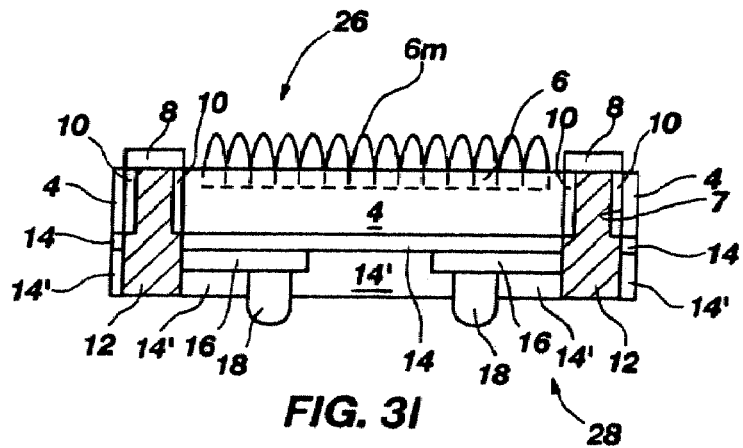
Figure 3J:
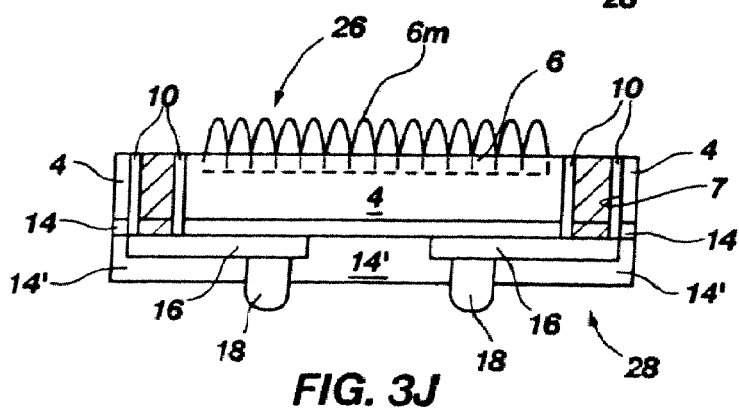

Referring to FIGS. 3I and 3J, a conductive material 12 may then be deposited within vias 7 to substantially fill vias 7 as performed in the previous embodiment of FIGS. 2A-2G using an electroless plating process, electroplating, solder filling, or a PVD process. As with the previous embodiments, a titanium nitride or tungsten seed layer may be employed to assist in the deposition of a conductive material 12, such as copper, by electroless plating. The conductive material 12 in vias 7 is in electrical communication with the array of optically interactive semiconductor devices 6 on the active surface 26 and with redistribution lines 16 to form a conductive pathway with it and conducive bumps 18.

Figure 4A:
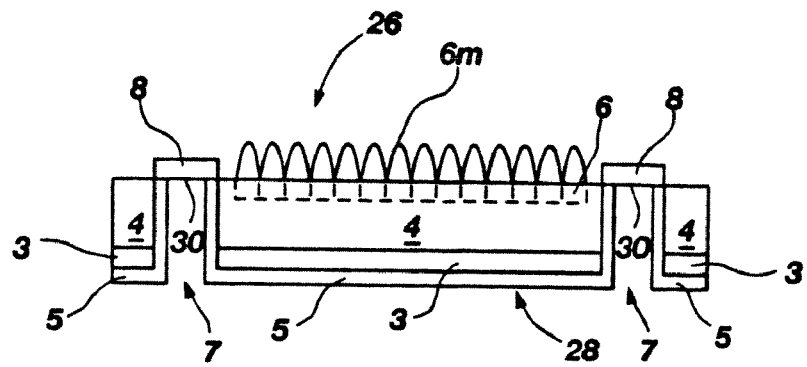
FIGS. 4A-4D illustrate yet another exemplary method of the present invention for forming low temperature processed back side redistribution lines and resulting structures.
Figure 4B:
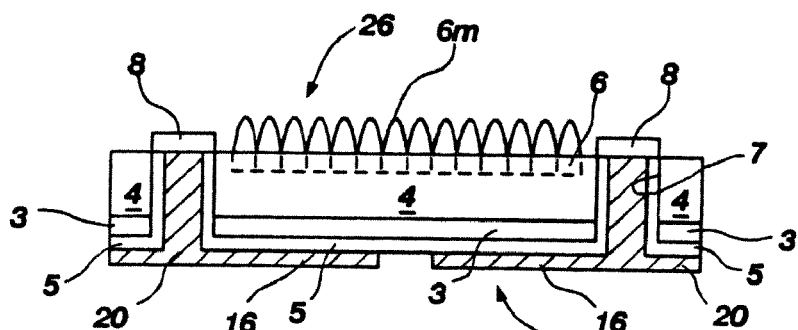

Another exemplary embodiment of a method of the present invention for fabricating a semiconductor device having a low temperature processed back side redistribution layer electrically connected to bond pads 8 using TWIs is illustrated in FIGS. 4A-4D. In the exemplary embodiments shown in FIGS. 4A-4D, vias 7 are filled with conductive material 20 and the back side 28 of substrate 4 is covered with conductive material 20 to integrally form both the metallization layer and fill the vias 7. Referring to FIG. 4A, the substrate 4 may be processed in the same manner as the embodiment illustrated in FIG. 2C with the back side 30 of each bond pad 8 exposed through dielectric layer 5, which has been disposed over dielectric layer 3 after vias 7 have been formed therethrough. A conductive material 20 may be deposited to substantially concurrently fill vias 7 and cover the dielectric layer 5 on the back side 28 of substrate 4. The conductive material 20 may be deposited to fill vias 7 and cover the dielectric layer 5 employing electroless plating, electroplating, sputtering, or another suitable technique. If desired or necessary, a seed layer, of about 5 Å to 100 Å, may be provided to assist with nucleation of the conductive material 20 during electroless plating of conductive material 20. Exemplary examples of seed layers are titanium nitride deposited by ALD at 155° C. sequentially using three precursor gases to form each monolayer: $TiCl_4$, $H_2$ and $NH_3$, or tungsten deposited using a $WF_6$ precursor gas by ALD at 170° C. to 200° C. The conductive material 20 may be photolithographically patterned and etched to form the redistribution lines 16 on the back side 28 of substrate 4 that connects each via 7 to its respective back side 30 of bond pad 8, resulting in the structure shown in FIG. 4B. Thus, in the present embodiment shown in FIG. 4B, the redistribution lines 16 are comprised of the same conductive material filling vias 7 and the conductive material 20 covering the dielectric layer 5 on the back side 28 of substrate 4. The redistribution lines 16 extend from associated vias 7 to predetermined distal locations on the back side 28 of substrate 4. Exemplary materials for the conductive material 20 may be aluminum, copper, and alloys thereof. An exemplary PVD deposition temperature for conductive material 20 is between about 100° C. and about 150° C. As with the deposition of dielectric layers 3 and 5, the deposition temperature of the conductive material 20 may be selected such that the deposition process does not damage any of the semiconductor devices or associated components on the active surface 26 of substrate 4. An exemplary deposition temperature for sputtering conductive material is between about 100° C. and about 150° C.

Figure 4C:
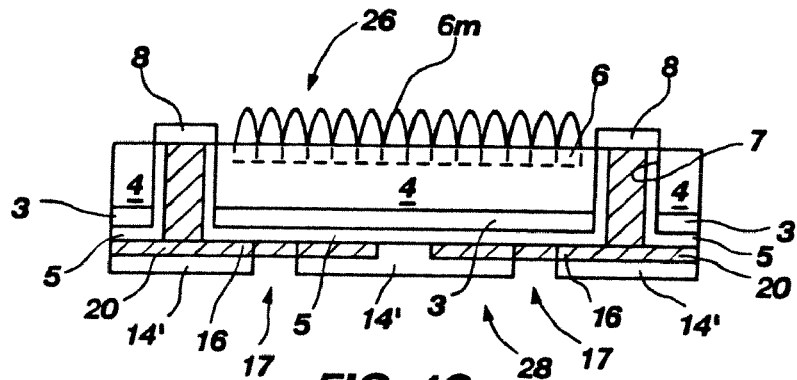
Figure 4D:
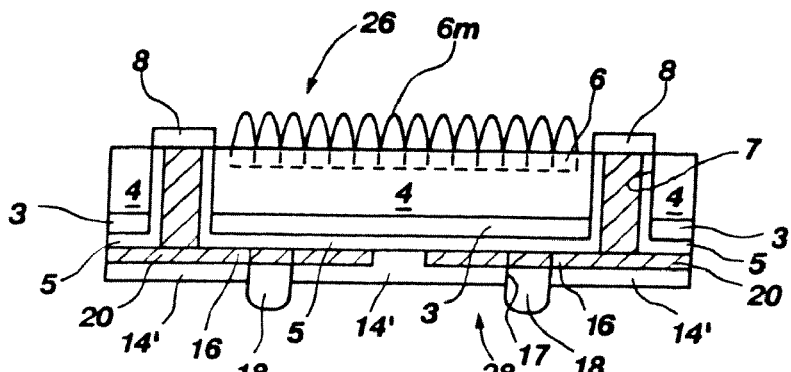

Referring to FIG. 4C, a dielectric layer 14' may be deposited to cover exposed portions of dielectric layer 5 and the redistribution lines 16. As with dielectric layers 3 and 5, the deposition of dielectric layer 14' may be identical in chemical composition to dielectric layers 3 and 5 and may be deposited in an identical manner to avoid damage to any of the semiconductor devices on the active surface 26 of substrate 4. Dielectric layer 14' may be photolithographically patterned and etched to form apertures 17 therethrough enabling access to redistribution lines 16. Conductive bumps 18 may be deposited in apertures 17 as in the previous embodiment of FIGS. 2A-2G, creating an electrically conductive pathway from a conductive bump 18 to redistribution line 16 to bond pad 8 as illustrated in FIG. 4D. It is noted that it may not be necessary to completely fill vias 7, but only to provide an adequate electrically conductive path from bond pads 8 along the sidewalls of vias 7 and out onto back side 28 along redistribution lines 16. If vias 7 are not completely filled, the dielectric layer 14' may be used to line the interior of conductive material 20.

Figure 5A:
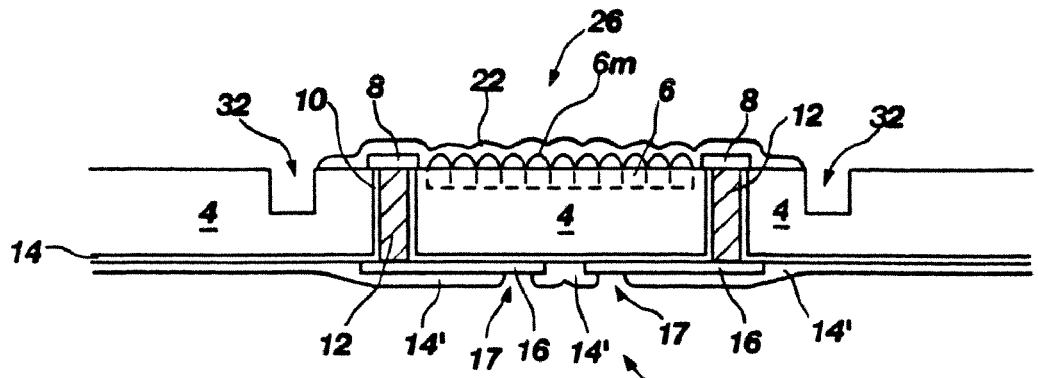
FIGS. 5A-5E illustrate an exemplary method of the present invention for stereolithographically forming a support structure adjacent the periphery of an array of optically interactive semiconductor devices.

Following forming the back side redistribution lines 16 by any one of the exemplary method embodiments shown in FIGS. 1-4, the semiconductor dice may be stereolithographically packaged and singulated as depicted in FIGS. 5A-5D. The TWIs may be formed, as in the aforementioned embodiments, prior to forming the redistribution lines 16 (FIGS. 2A-2G), after forming the redistribution lines 16 (FIGS. 3A-3J), or substantially simultaneously therewith (FIGS. 4A-4D). However, with respect to FIGS. 5A-5D, the exemplary embodiment is shown with the TWIs being formed after the redistribution lines 16. Referring to FIG. 5A, an array of optically interactive semiconductor devices 6 and bond pads 8 may be covered with a protective layer 22. Protective layer 22 may be any material that is optically transparent to the desired wavelengths of light required for the operation of the array of optically interactive semiconductor devices 6. Suitable materials for exemplary protective layer 22 include silicon oxynitride, silicon dioxide, borosilicate glass (BSG), phosphosilicate glass (PSG), borophosphosilicate glass (BPSG). Another suitable material for protective layer 22 is a UV-curable photopolymer that is optically transparent to the desired wavelength of light required for the operation of the array of optically interactive semiconductor devices 6. Protective layer 22 may be deposited at a temperature such that it does not damage the optically interactive semiconductor devices 6 or associated components on the active surface 26 of substrate 4. Protective layer 22 may be deposited below the cure temperature of the polymer used to form the microlenses 6m. If a polyimide polymer is used for the microlenses 6m and cured at 220° C., the deposition temperature of protective layer 22 may be below 220° C.

Figure 5B:
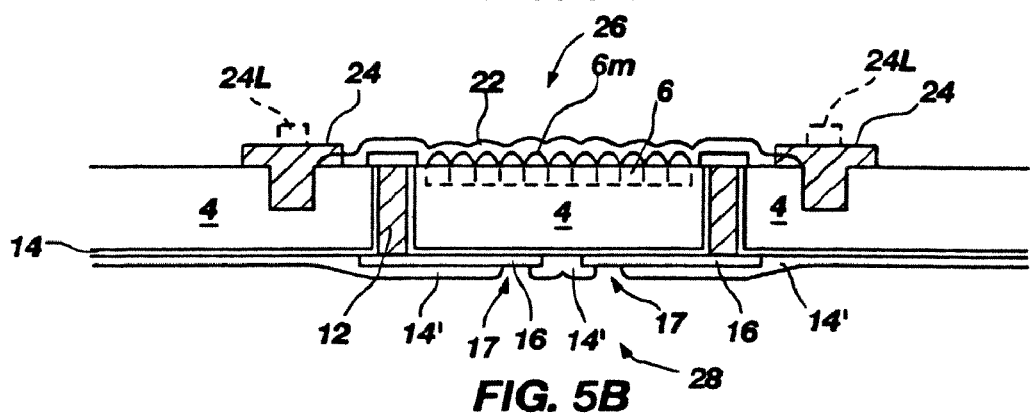
Figure 5C:
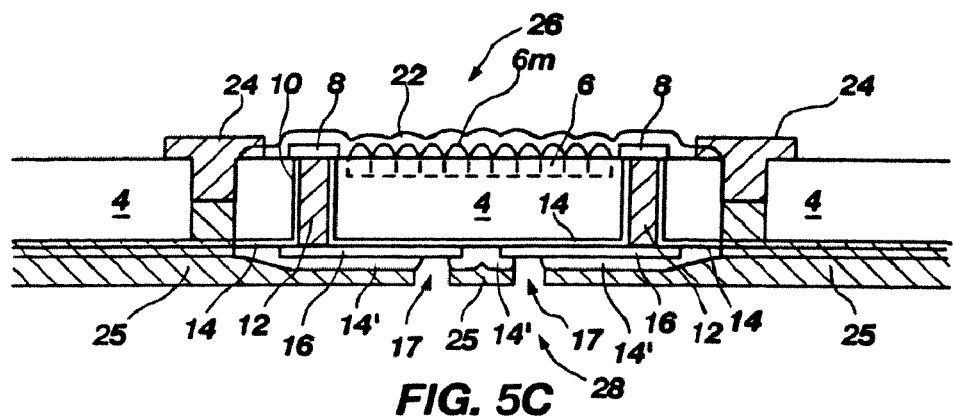

Again referring to FIG. 5A, trench 32 extending about a periphery of array of optically interactive semiconductor devices 6 on the substrate 4 may be formed using a wafer saw, laser ablation, etching, or other suitable techniques. If laser ablation or a wafer saw is used to form trench 32, fiducial marks on substrate 4 or a machine vision system may be used for precise alignment of the laser beam or wafer saw (not shown). FIG. 5B depicts the dielectric support structure 24 so formed to fill trench 32 and cover portions of the active surface 26 adjacent to the vias 7. The dielectric support structure 24 may be formed by immersing the substrate 4 in a liquid photopolymerizable resin to a desired depth followed by at least partially curing portions thereof using an appropriate UV light source (e.g., a laser) in the desired location to form an at least partially cured layer. This process is repeated until the complete dielectric support structure 24 is so formed by multiple superimposed layers of at least partially cured photopolymer. The dielectric support structure 24 also assists with electrically insulating bond pads 8 by abutting protective layer 22 and may be configured to form a mechanical support for an infrared (IR) filter that may be employed to cover the array of optically interactive semiconductor devices 6. Referring to FIG. 5C, the back side 28 of substrate 4 may be cut to form a trench extending about a periphery of array of optically interactive semiconductor devices 6 of substrate 4 that is substantially aligned with and parallel to the trench 32 formed on the active surface 26, stopping at the dielectric support structure 24 at the bottom of trench 32. The stereolithography process may then be repeated to form dielectric cover structure 25. The dielectric cover structure 25 fills the trench 32 diced on the back side 28 and covers the back side 28 except for apertures 17 that expose the redistribution lines 16 therethrough. Optionally, the dielectric layer 14' covering the redistribution lines 16 may be omitted because the dielectric cover structure 25 may be formed of a material suitable for electrically insulating, as well as mechanically and environmentally protecting the back side 28. Dielectric support structure 24 and dielectric cover structure 25 may be fully cured by heating substrate 4 to an elevated temperature, again below that which might damage semiconductor devices 6 and microlenses 6m.

Figure 5D:
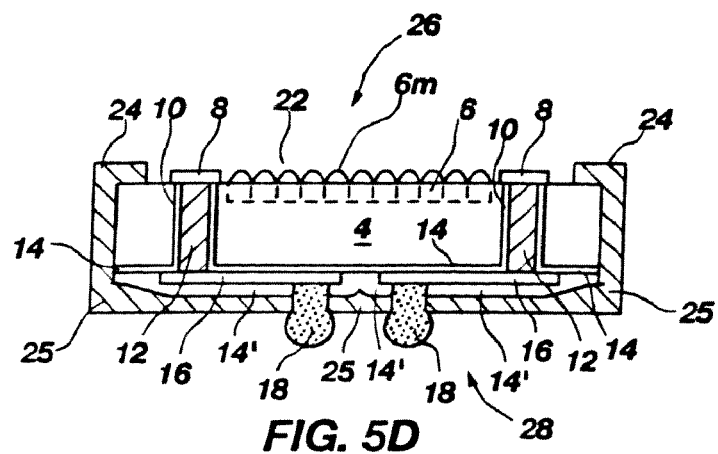
Figure 5E:
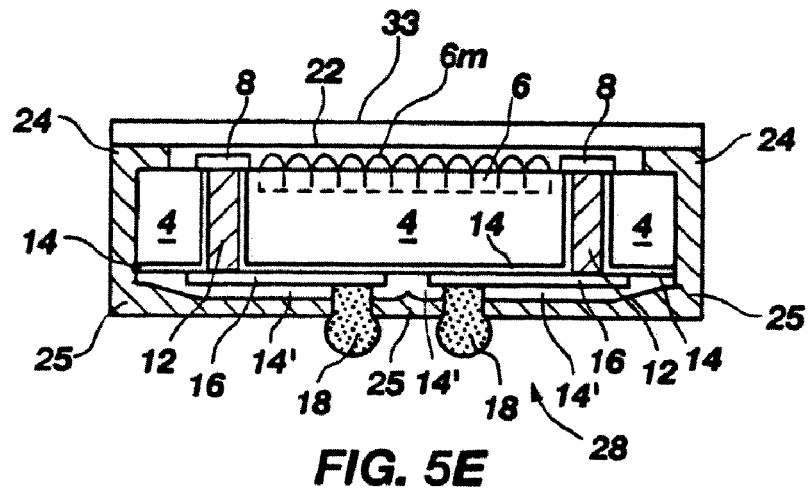

Referring to FIG. 5D, conductive bumps 18 may be applied as performed in the aforementioned embodiments to electrically connect to the redistribution line 16. Alternatively, conductive bumps 18 may already be formed and the dielectric cover structure 25 may be selectively placed and fully cured to surround the plurality of conductive bumps 18. Each array, or a group of arrays of optically interactive semiconductor devices 6 may be singulated using a wafer saw or other suitable method, forming isolated stereolithographically packaged arrays, each comprising optically interactive semiconductor devices 6. An array of optically interactive semiconductor devices 6 may be singulated by cutting the dielectric support structure 24 and dielectric cover structure 25 about down the centerline of the trench 32, filled with the cured photopolymer, with a wafer saw. If an IR filter is to be employed, the dielectric support structure 24 maybe optionally configured with an upstanding lip 24L surrounding each array of optically interactive semiconductor devices 6 as shown in broken lines in FIG. 5B and an IR filter 33 (see FIG. 5E) attached within the recess defined by the lip 24L to the dielectric support structure 24 on the active surface 26 using an adhesive or other suitable technique to cover the optically interactive semiconductor devices 6. As shown in FIG. 5E, the lip 24L may be omitted and the IR filter 33 merely adhered to an upper surface of the dielectric support structure 24. Typically, the IR filters 33 would be placed prior to singulation. Further, a sheet of an IR filter material may be placed over the entirety of a bulk substrate, covering a plurality of arrays of optically interactive semiconductor devices 6 and adhered to dielectric support structures 24 circumscribing each array, and the sheet singulated with the arrays.

The reader is directed to U.S. Pat. No. 6,537,482 to Farnworth, which discloses suitable, exemplary stereolithographic processing techniques for forming the protective layer 22, dielectric support structure 24, and dielectric cover structure 25. The disclosure of U.S. Pat. No. 6,537,482 is hereby incorporated herein in its entirety by this reference. Suitable liquid photopolymerizable resins for forming protective layer 22, dielectric support structure 24, and dielectric cover structure 25 include, without limitation, ACCURA® SI 40 Hc and AR materials and CIBATOOL® SL 5170 and SL 5210 resins for the SLA® 250/50HR and SLA® 500 systems, ACCURA® SI 40 ND material and CIBATOOL® SL 5530 resin for the SLA® 5000 and 7000 systems, and CIBATOOL® SL 7510 resin for the SLA 7000 system. The ACCURA® materials are available from 3D Systems, Inc., of Valencia, Calif., while the CIBATOOL® resins are available from Ciba Specialty Chemicals Inc. of Basel, Switzerland.

Figure 6A:
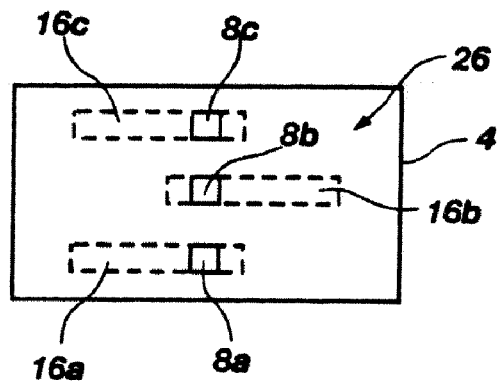
FIGS. 6A and 6B illustrate an exemplary semiconductor memory device having low temperature processed redistribution lines formed in accordance with the present invention.
Figure 6B:
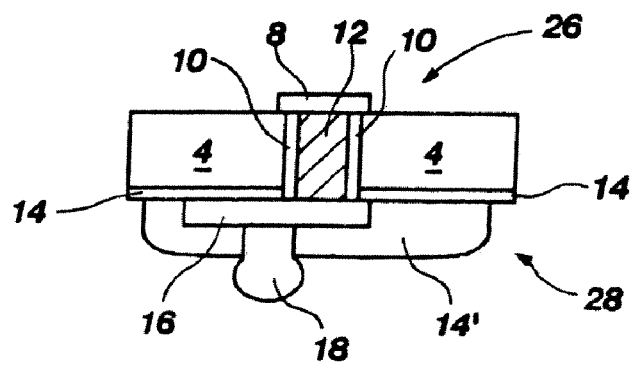

Referring to FIGS. 6A and 6B, the low temperature processed back side redistribution lines 16 of the aforementioned embodiments of FIGS. 2A-4D, may be also implemented for other types of semiconductor devices such as, for example, semiconductor memory devices. Instead of substrate 4 having semiconductor dice 1 with each die including an array of optically interactive semiconductor devices 6 on its active surface 26, substrate 4 may include a plurality of interconnected semiconductor dice or a single semiconductor die and its associated circuitry. The semiconductor die or dice may form a semiconductor memory device such as, for example, a DRAM, RDRAM, SRAM, MRAM, EEPROM, FLASH memory, microprocessor, logic device or other type of semiconductor device. The bond pads 8 may be centrally located on the active surface 26 as opposed to being located adjacent the periphery of the semiconductor die when the active surface 26 contains an array of optically interactive semiconductor devices 6. The locations of bond pads 8 is immaterial to the present invention, and not to be construed in any manner as limiting thereof. The low temperature processing used for forming the various layers comprising the back side redistribution lines 16 and the TWIs may be selected so as not to damage any of the semiconductor devices on the active surface 26 comprising the memory device. However, the processing temperatures to form the back side redistribution lines 16 and TWIs may be performed at a slightly higher temperature for the semiconductor memory devices in contrast to that of the optically interactive semiconductor devices 6 of FIGS. 1B-4D. For memory devices and other semiconductor devices not employing particularly temperature-sensitive components, such as microlenses, the processing temperature for forming the various layers that comprise the back side redistribution lines and the TWIs may be selected to be below 250° C. Above 250° C., semiconductor memory devices randomize, affecting device performance. Above 300° C., diffusion occurs between the various layers comprising the redistribution lines and the TWIs. Dopant redistribution may also occur above 300° C., further degrading memory device operation and performance.

Again referring to FIG. 6A, substrate 4 is depicted as a semiconductor die having an active surface 26 containing at least one semiconductor device thereon with corresponding generally centrally located bond pads 8a-8c. FIG. 6B shows a sectional view of FIG. 6A illustrating the TWI structure filled with conductive material 12, the back side redistribution lines 16, dielectric layers 10 and 14, and conductive bumps 18. Again, although the exemplary embodiment of FIGS. 6A and 6B is shown with the TWI being formed after the redistribution lines 16, the TWIs may be formed prior to forming the redistribution lines 16, or substantially simultaneous to forming the redistribution lines 16.

Figure 7:
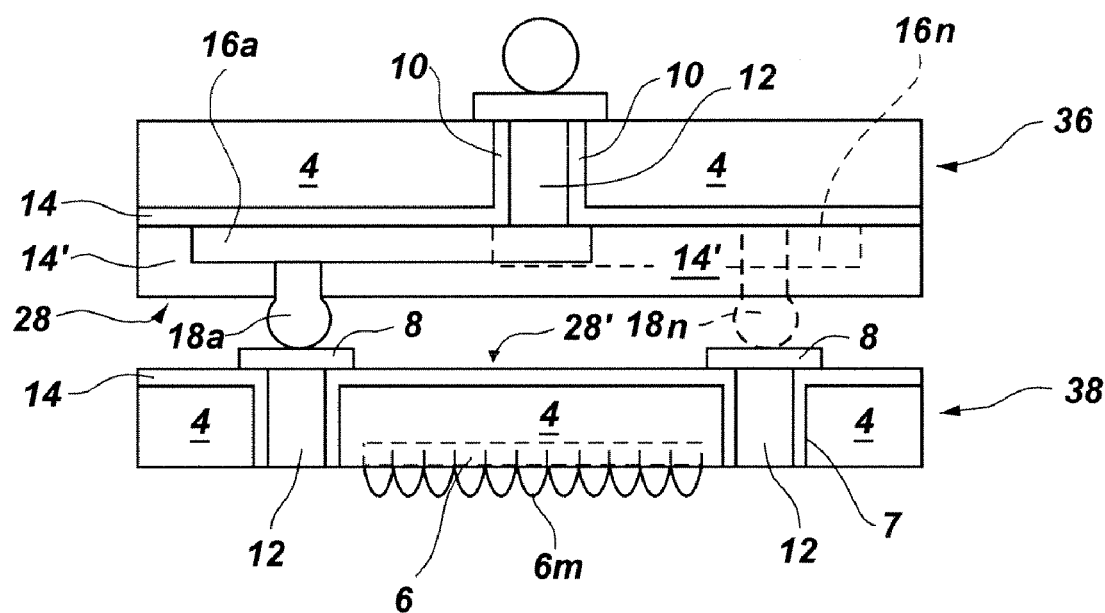
FIG. 7 illustrates a sectional view of a stacked semiconductor device assembly in accordance with the present invention.

The semiconductor devices of the present invention, having low temperature processed back side redistribution lines may be stacked and connected to another semiconductor device such as, for example an optically interactive semiconductor device or a higher-level device, such as PCBs. Referring to FIGS. 6A and 7, a semiconductor memory device 36 having low temperature processed back side redistribution lines 16, formed in accordance with the present invention, is electrically connected to an optically interactive semiconductor memory device 38. The devices may be connected back side-to-back side enabling electrically connecting devices that have their respective bond pads on their back surfaces in different positions (i.e., misaligned). As shown in FIG. 7, the back side 28 containing redistribution lines 16a-16n and respective conductive bumps 18a-18n of semiconductor memory device 36 maybe electrically connected to the bond pads 8 of the back side 28' of the optically interactive semiconductor device 38. Optically interactive semiconductor device 38 includes vias 7 filled with electrically conductive material 12 with each via 7 capped with a bond pad 8. Vias 7 are in electrical communication with the array of optically interactive semiconductor devices 38. Vias 7, formed in accordance with the present invention, extend through substrate 4 and the positions of vias 7 correspond to the respective positions of conductive bumps 18a-18n of semiconductor memory device 36. The semiconductor memory device 36 may also be connected to other higher-level devices, such as PCBs, etc., instead of optically interactive semiconductor device 38.

Although the foregoing description contains many specifics, these are not to be construed as limiting the scope of the present invention, but merely as providing certain exemplary embodiments. Similarly, other embodiments of the invention may be devised that do not depart from the spirit or scope of the present invention. The scope of the invention is, therefore, indicated and limited only by the appended claims and their legal equivalents, rather than by the foregoing description. All additions, deletions, and modifications to the invention, as disclosed herein, which fall within the meaning and scope of the claims, are encompassed by the present invention.

What is claimed is:

1. A method of fabricating a semiconductor device comprising:

forming at least one via in a semiconductor substrate comprising at least one semiconductor die, the at least one via extending substantially perpendicular to a back surface of the semiconductor substrate and exposing a bottom portion of a bond pad located on an active surface of the substrate;

depositing a dielectric layer over the back surface, an inner region of the at least one via, and the bottom portion of the bond pad;

exposing a portion of the bond pad through the dielectric layer;

depositing a conductive material within the at least one via;

forming at least one redistribution line in electrical communication with the conductive material on at least a portion of the dielectric layer and on the conductive material; and depositing another dielectric layer over the at least one redistribution line and exposed portions of the dielectric layer;

exposing at least one portion of the at least one redistribution line through the another dielectric layer; and wherein depositing each of the dielectric layer, the another dielectric layer, and the conductive material and forming the at least one redistribution line is effected below a temperature sufficient to cause operational or physical damage to the semiconductor device.

2. The method of claim 1, further comprising depositing a metallization layer on the dielectric layer and the conductive material prior to forming the at least one redistribution line.

3. The method of claim 2, wherein depositing the metallization layer is effected at a temperature between about 100° C. to about 150° C.

4. The method of claim 2, wherein forming the at least one redistribution line is effected by photolithographically patterning and etching the metallization layer.

5. The method of claim 1, further comprising applying a discrete conductive element on the at least one exposed portion of the at least one redistribution line.

6. The method of claim 1, further comprising:

forming a first trench along a periphery of the at least one semiconductor die, the first trench adjacent to the at least one via and extending from the active surface to a predetermined depth within the semiconductor substrate;

forming a dielectric support structure to fill the first trench and cover a portion of the active surface adjacent the first trench;

forming a second trench along the periphery of the at least one semiconductor die, the second trench adjacent to the at least one via and extending from the back surface to the predetermined depth within the semiconductor substrate;

forming a dielectric cover structure to fill the second trench and cover the back surface of the at least one semiconductor die leaving exposed the at least one exposed portion of the at least one redistribution line; and singulating the at least one semiconductor die by cutting through portions of the dielectric support structure and the dielectric cover structure.

7. The method of claim 6, further comprising depositing an optically transparent protective layer over the at least one semiconductor die prior to singulating the at least one semiconductor die.

8. The method of claim 7, wherein depositing an optically transparent protective layer is effected below a temperature sufficient to cause operational or physical damage to the semiconductor device.

9. A method of fabricating a semiconductor device comprising:

forming at least one via in a semiconductor substrate comprising at least one semiconductor die, the at least one via extending substantially perpendicular to a back surface of the semiconductor substrate and exposing a bottom portion of a bond pad located on an active surface of the substrate;

depositing a dielectric layer over the back surface and an inner region of the at least one via;

exposing a portion of the bond pad through the dielectric layer;

depositing substantially concurrently a conductive material within the at least one via and on at least a portion of the dielectric layer;

forming at least one redistribution line from the conductive material on the at least a portion of the dielectric layer;

depositing another dielectric layer over the at least one redistribution line and on a portion of the dielectric layer;

exposing at least one portion of the at least one redistribution line through the another dielectric layer; and wherein depositing each of the dielectric layer, the another dielectric layer, and the conductive material is effected below a temperature sufficient to cause operational or physical damage to the semiconductor device.

10. The method of claim 9, wherein forming the at least one redistribution line is effected by photolithographically patterning and etching the conductive material.

11. The method of claim 9, further comprising depositing a discrete conductive element on the at least one exposed portion of the at least one redistribution line.

12. The method of claim 9, further comprising:

forming a first trench and a second trench along a periphery of the at least one semiconductor die, the first trench and the second trench adjacent to the at least one via, the first trench extending from the active surface to a predetermined depth within the semiconductor substrate and the second trench extending from the back surface to the predetermined depth;

forming a dielectric support structure to fill the first trench and cover a portion of the active surface adjacent the first trench;

forming a dielectric cover structure to fill the second trench and cover the back surface of the at least one semiconductor die leaving exposed the at least one exposed portion of the at least one redistribution line; and singulating the at least one semiconductor die by cutting through portions of the dielectric support structure and the dielectric cover structure.

13. The method of claim 12, further comprising applying at least one discrete conductive element on the at least one exposed portion of the at least one redistribution line prior to singulating the at least one semiconductor die.

14. A method of fabricating a semiconductor device comprising:

depositing a first dielectric layer on a back surface of a semiconductor substrate comprising at least one semiconductor die;

forming at least one redistribution line on at least a portion of the first dielectric layer;

depositing a second dielectric layer on the at least one redistribution line and on a portion of the first dielectric layer;

exposing a portion of the at least one redistribution line through the second dielectric layer;

forming at least one via extending from proximate an active surface to a surface of the at least one redistribution line;

depositing a third dielectric layer to cover an inner region of the at least one via;

depositing an electrically conductive material within the at least one via in electrical communication with the at least one redistribution line; and wherein the depositing the first dielectric layer, the second dielectric layer, the third dielectric layer, the at least one redistribution line, and the electrically conductive material is effected below a temperature sufficient to cause operational or physical damage to the semiconductor device.

15. The method of claim 14, further comprising depositing at least one of an aluminum layer, a copper layer, and an alloy layer on the first dielectric layer prior to forming the at least one redistribution line.

16. The method of claim 15, wherein depositing at least one of an aluminum layer, a copper layer, and an alloy layer is effected using sputtering at a temperature between about 100° C. to about 150° C.

17. The method of claim 15, wherein forming the at least one redistribution line comprises photolithographically patterning and etching at least one of the aluminum layer, the copper layer, and the alloy layer.

18. The method of claim 14, wherein exposing a portion of the at least one redistribution line comprises forming at least one aperture in the second dielectric layer by photolithographically patterning and etching the second dielectric layer.

19. The method of claim 14, further comprising:

forming a first trench along a periphery of the at least one semiconductor die, the first trench adjacent to the at least one via and extending from the active surface to a predetermined depth within the semiconductor substrate;

forming a second trench along the periphery of the at least one semiconductor die, the second trench adjacent to the at least one via and extending from the back surface to a portion of the first trench at the predetermined depth;

forming a dielectric support structure within the first trench and covering a portion of the active surface adjacent the first trench;

forming a dielectric cover structure within the second trench and covering the back surface leaving exposed the exposed portion of the at least one redistribution line; and singulating the at least one semiconductor die by cutting through portions of the dielectric support structure and the dielectric cover structure.

20. The method of claim 19, further comprising electrically connecting the at least one redistribution line of the at least one semiconductor die to another substrate after singulating the at least one semiconductor die.

21. A method of fabricating a semiconductor device comprising:

forming at least one via in a semiconductor substrate extending from a back surface of the substrate to a back side of a bond pad located on an active surface of the substrate, the semiconductor substrate comprising at least one semiconductor die on the active surface;

depositing a dielectric layer over the back surface and an inner region of the at least one via;

exposing a portion of the back side of the bond pad through the dielectric layer;

depositing a conductive material within the at least one via and on at least a portion of the dielectric layer substantially simultaneously;

forming at least one redistribution line from the conductive material on the at least a portion of the dielectric layer;

depositing another dielectric layer over a portion of the dielectric layer and the at least one redistribution line; and wherein depositing each of the dielectric layer, the another dielectric layer, and the conductive material is effected below a temperature sufficient to cause operational or physical damage to the semiconductor device.

22. The method of claim 21, further comprising exposing at least one portion of the at least one redistribution line through the another dielectric layer.

23. A method of fabricating a semiconductor device comprising:

depositing a first dielectric layer on a back surface of a semiconductor substrate comprising at least one semiconductor die;

forming at least one conductive trace on at least a portion of the first dielectric layer;

depositing a second dielectric layer on the at least one conductive trace and on a portion of the first dielectric layer;

forming at least one via extending from proximate an active surface to at least a surface of the at least one conductive trace;

depositing a third dielectric layer to cover an inner region of the at least one via;

depositing an electrically conductive material within the at least one via in electrical communication with the at least one conductive trace; and wherein the depositing the first dielectric layer, depositing the second dielectric layer, depositing the third dielectric layer, depositing the electrically conductive material, and forming the at least one conductive trace is effected below a temperature sufficient to cause operational or physical damage to the semiconductor device.

24. The method of claim 23, further comprising exposing a portion of the at least one conductive trace through the second dielectric layer.

25. The method of claim 23, wherein forming at least one via extending from proximate the active surface to at least a surface of the at least one conductive trace comprises forming the at least one via extending from proximate the active surface through the second dielectric layer.

* * * * *